(12) United States Patent
Yun

(10) Patent No.: US 9,343,174 B2
(45) Date of Patent: May 17, 2016

(54) DATA STORAGE CIRCUIT AND SYSTEM INCLUDING THE SAME

(71) Applicant: SK hynix Inc., Icheon-si Gyeonggi-do (KR)

(72) Inventor: Dae Ho Yun, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/535,430

(22) Filed: Nov. 7, 2014

(65) Prior Publication Data

US 2016/0012909 A1  Jan. 14, 2016

(30) Foreign Application Priority Data

Jul. 9, 2014 (KR) .................. 10-2014-0086276

(51) Int. Cl.
  *G11C 17/00* (2006.01)
  *G11C 17/16* (2006.01)
  *G11C 17/18* (2006.01)
  *G11C 7/20* (2006.01)

(52) U.S. Cl.
  CPC *G11C 17/16* (2013.01); *G11C 7/20* (2013.01); *G11C 17/18* (2013.01)

(58) Field of Classification Search
  CPC .............................. G11C 17/16; G11C 17/18
  USPC ................................................. 365/96, 225.7
  See application file for complete search history.

(56) References Cited

U.S. PATENT DOCUMENTS

| 7,609,539 B2 | 10/2009 | Peng et al. | |
| 2009/0027973 A1* | 1/2009 | Nakayama | G11C 17/18 365/189.05 |

FOREIGN PATENT DOCUMENTS

KR 1020130077626 A  7/2013

* cited by examiner

*Primary Examiner* — Huan Hoang
(74) *Attorney, Agent, or Firm* — William Park & Associates Ltd.

(57) ABSTRACT

A data storage circuit includes a first antifuse which is programmed in response to a first access signal, and provide data indicating whether the first antifuse is programmed to a data node, an initialization section which controls a voltage level of the data node in response to an initialization flag, and a second antifuse which is programmed in response to the first access signal, and provide the initialization flag indicating whether the second antifuse is programmed to the initialization section.

19 Claims, 5 Drawing Sheets

FIG.1
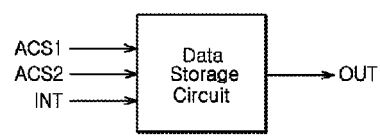
FIG.2
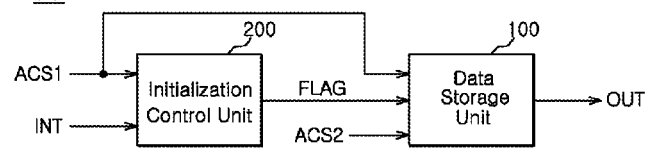
FIG.3
| ACS1 | ACS2 | INT | Operation |
|---|---|---|---|
| EN_H | EN | | Data Program |
| EN_H | | EN | Initialization Flag Program (Data Initialization) |
| EN | EN | | Output to output line |
EN_H : High Voltage Enable    EN : Enable

DATA STORAGE CIRCUIT AND SYSTEM INCLUDING THE SAME

CROSS-REFERENCES TO RELATED APPLICATION

The present application claims priority under 35 U.S.C. §119(a) to Korean application number 10-2014-0086276 filed on Jul. 9, 2014, in the Korean Intellectual Property Office, which is incorporated herein by reference in its entirety.

BACKGROUND

1. Technical Field

Embodiments of the present invention generally relate to an integrated circuit, and more particularly to a data storage circuit capable of storing data.

2. Related Art

Integrated circuits are sets of electronic circuits on a small chip. Semiconductor memories are electronic devices for storing data, which may be implemented on a semiconductor-based integrated circuit. There are two types of semiconductor memories: a nonvolatile type, and a volatile type.

In a nonvolatile memory device, stored data may be retained even in absence of power supply. Nonvolatile memory devices include flash memory devices, FeRAM (ferroelectric random access memory) devices, PCRAM (phase change random access memory) devices, MRAM (magnetic random access memory) devices, and ReRAM (resistive random access memory) devices. The volatile memory device may be used in a data processing system as a buffer memory device, a cache memory device, or a working memory device.

In contrast, a volatile memory device requires power to maintain the stored data. Volatile memory devices include SRAM (static random access memory) devices and DRAM (dynamic random access memory) devices.

An electronic device may include an one time programmable ("OTP") memory therein. The OTP means that, once data are written to into a memory, the data therein are permanent and cannot be changed. The OTP memory may be used in an electronic device to store important information with respect to the electronic device.

SUMMARY

In an embodiment of the invention, a data storage circuit may include: a first antifuse configured to be programmed in response to a first access signal, and provide data indicating whether the first antifuse is programmed to a data node; an initialization section configured to control a voltage level of the data node in response to an initialization flag; and a second antifuse configured to be programmed in response to the first access signal, and provide the initialization flag indicating whether the second antifuse is programmed to the initialization section.

In an embodiment of the invention, a data storage circuit may include: a first antifuse configured to be programmed in response to a first access signal, and provide data indicating whether the first antifuse is programmed to a data node; an initialization section configured to electrically connect the data node to a ground voltage terminal in response to an initialization flag; and an access control section configured to output data which is provided to the data node, to an output line in response to a second access signal.

In an embodiment of the invention, an electronic system may include: a controller configured to generate a first access signal, to a second access signal, and an initialization signal; a data storage circuit configured to be programmed in response to the first access signal and the second access signal, be initialized in response to the first access signal and the initialization signal, and output data indicating whether the data storage circuit is programmed or initialized in response to the first access signal and the second access signal.

BRIEF DESCRIPTION OF THE DRAWINGS

Features, aspects, and embodiments are described in conjunction with the attached drawings, in which:

FIG. 1 is a block diagram showing an example data storage circuit in accordance with an embodiment of the invention;

FIG. 2 is a block diagram showing in detail the data storage circuit shown in FIG. 1;

FIG. 3 is a table explaining operations of the data storage unit and the initialization control unit shown in FIG. 2 according to whether signals applied to the data storage circuit are enabled or not;

DETAILED DESCRIPTION

Figure 4A:
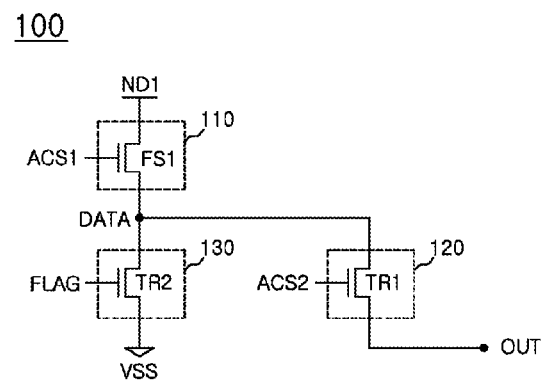
FIG. 4A is a circuit diagram showing in detail the data storage unit shown in FIG. 2.

FIG. 1 is a block diagram showing an example data storage circuit 10 in accordance with an embodiment of the invention.

Referring to FIG. 1, the data storage circuit 10 is coupled to one or more input lines for receiving a first access signal ACS1, a second access signal ACS2, and an initialization signal INT, and also coupled to one or more output lines.

The data storage circuit 10 may be programmed and initialized. The data storage circuit 10 may output data, which indicate whether the data storage circuit 10 is programmed or initialized, to the output line OUT.

The data storage circuit 10 may be programmed in response to the first access signal ACS1 and the second access signal ACS2.

The data storage circuit 10 may be initialized in response to the first access signal ACS1 and an initialization signal INT. For example, the data storage circuit 10 may be initialized by using an initialization flag. The data storage circuit 10 may store an initialization flag in the data storage circuit 10 in response to the first access signal ACS1 and the initialization signal INT.

The data storage circuit 10 may output data, which indicate whether the data storage circuit 10 is programmed or initialized, to the output line OUT in response to the first access signal ACS1 and is the second access signal ACS2. The data storage circuit 10 may output data indicating whether the data storage circuit 10 is programmed or initialized according to the initialization flag. If the data storage circuit 10 has no initialization flag, the data storage circuit 10 may output data indicating that the data storage circuit 10 is programmed to the output line OUT in response to the first access signal ACS1 and the second access signal ACS2. If the data storage circuit 10 has the initialization flag, the data storage circuit 10 may output data indicating that the data storage circuit 10 is initialized to the output line OUT in response to the first access signal ACS1 and the second access signal ACS2.

The first access signal ACS1 may be a pulse-type signal the high voltage of which may program or initialize the data storage circuit 10. The level of the high voltage may be, for example, higher than the level of an external voltage which is being applied from an external device. The high voltage may have a predetermined voltage level necessary to rupture an antifuse included in the data storage circuit 10 (not shown in FIG. 1). The first access signal ACS1 may be enabled to a voltage level lower than the predetermined high voltage, after the data storage circuit 10 has been programmed or initialized. For example, after the data storage circuit 10 has programmed data or has initialized programmed data, the first access signal ACS1 may be enabled to a voltage level corresponding to the external voltage.

An embodiment of the present invention may include a is controller for controlling the data storage circuit 10. The controller may generate the first access signal ACS1, the second access signal ACS2, and the initialization signal INT, and provide these signals to the data storage circuit 10 to control the program operation, the initialization operation, and the data output operation of the data storage circuit 10. The controller may include a high voltage generation unit (not shown) for enabling the first access signal ACS1 as a high voltage pulse.

FIG. 2 is a block diagram showing in detail the data storage circuit 10 shown in FIG. 1.

The data storage circuit 10 may include a data storage unit 100 and an initialization control unit 200.

The data storage unit 100 may be programmed in response to the first access signal ACS1 and the second access signal ACS2. The data storage unit 100 may be programmed by receiving the first access signal ACS1 which is enabled to a high voltage level.

The data storage unit 100 may be initialized in response to an initialization flag FLAG.

The data storage unit 100 may output data, which indicate to whether the data storage circuit 10 is programmed or initialized, to the output line OUT in response to the first access signal ACS1 and the second access signal ACS2. In the case where the data storage unit 100 has been programmed, when the first access signal ACS1 and the second access signal ACS2 are enabled, the data storage unit 100 may output data indicating that the data storage circuit 10 is programmed. In the case where the data storage unit 100 has been initialized, when the first access signal ACS1 and the second access signal ACS2 are enabled, the data storage unit 100 may output data indicating that the data storage circuit 10 is initialized.

The initialization control unit 200 may provide the initialization flag FLAG to the data storage unit 100 in response to the first access signal ACS1 and the initialization signal INT. The initialization control unit 200 may be applied with the first access signal ACS1 which is enabled to a high voltage level to be programmed for providing the initialization flag FLAG.

FIG. 3 is a table explaining operations of the data storage unit 100 and the initialization control unit 200 shown in FIG. 2 according to whether signals applied to the data storage circuit 10 are enabled or not.

If the first access signal ACS1 is enabled to the predetermined high voltage and the second access signal ACS2 is enabled, the data storage unit 100 may be programmed.

If the first access signal ACS1 is enabled to the high voltage and the initialization signal INT is enabled, the initialization control unit 200 may provide the initialization flag FLAG to the data storage unit 100. In other words, if the first access signal ACS1 is enabled to the high voltage and the initialization signal INT is enabled, the data storage unit 100 may be initialized.

If the first access signal ACS1 is enabled and the second access signal ACS2 is enabled, the data storage unit 100 may output data indicating whether the data storage circuit 10 is programmed or initialized to the output line OUT.

FIG. 4a is a circuit diagram showing in detail the data storage unit 100 shown in FIG. 2.

The data storage unit 100 may include a program section 110, an access control section 120, and an initialization section 130. The program section 110 may electrically connect a first node ND1 to a data node DATA. The access control section 120 may electrically connect the data node DATA to the output line OUT. The initialization section 130 may electrically connect the data node DATA to a ground voltage terminal VSS.

The program section 110 may be programmed in response to the first access signal ACS1, and provide data indicating that the program section 110 is programmed to the data node DATA. The program section 110 may include a first antifuse FS1.

The first antifuse FS1 may be ruptured in response to the first access signal ACS1. The program section 110 may be programmed by rupturing the first antifuse FS1. The ruptured first antifuse FS1 may supply a voltage to the data node DATA in response to the first access signal ACS1, and the supplied voltage may indicate that the program section 110 is programmed. The first access signal ACS1 may be enabled as a high voltage pulse with a level enough to rupture the first antifuse FS1. After the first antifuse FS1 is ruptured, the first access signal ACS1 may be enabled to a lower level, for example, the level of an external voltage.

The first antifuse FS1 may electrically connect the first node ND1 to the data node DATA. The first antifuse FS1 may also be applied with the first access signal ACS1 through the gate thereof. The first node ND1 may be a floating node.

The access control section 120 may electrically connect the data node DATA to the output line OUT in response to the second access signal ACS2. In the case where the access control section 120 is applied with an enabled second access signal ACS2 and the first antifuse FS1 is applied with the first access signal ACS1, which is enabled to the high voltage, the voltage between the gate and the source of the first antifuse FS1 may be enough to rupture the first antifuse FS1. The access control section 120, which electrically connects the data node DATA to the output line OUT, may output the voltage of the data node DATA to the output line OUT.

The access control section 120 may include a first transistor TR1. The first transistor TR1 may electrically connect the data node DATA to the output line OUT, and may be applied with the second access signal ACS2 through the gate thereof.

The initialization section 130 may electrically connect the data node DATA to a ground voltage terminal VSS in response to the initialization flag FLAG. By connecting the data node DATA to the ground voltage terminal VSS, the initialization section 130 may initialize the data node DATA. In the case where the initialization section 130 does not connect the data node DATA to the ground voltage terminal VSS, the data node DATA may not be initialized but retain its prior voltage level.

The initialization section 130 may include a second transistor TR2. The second transistor TR2 may electrically connect the data node DATA to the ground voltage terminal VSS, and may be applied with the initialization flag FLAG through the gate thereof.

Figure 4B:
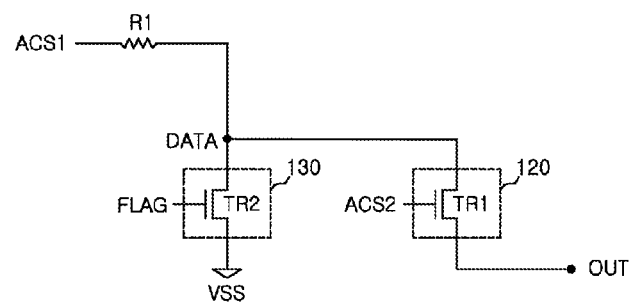
FIG. 4B shows an equivalent circuit of the data storage unit which is programmed.

FIG. 4b shows an example of an equivalent circuit of the data storage unit 100 which is programmed. In FIG. 4b, the same reference numerals as in FIG. 4a will be used to refer to component elements substantially the same as those of FIG. 4a.

The data storage unit 100a may be programmed by rupturing the first antifuse FS1. The ruptured first antifuse FS1 may be equivalent to a first resistor R1. The first access signal ACS1 may be provided through the first resistor R1 to the data node DATA as the data indicating that data storage unit 100a is programmed (e.g., indicating the antifuse FS1 became equivalent to the first resistor R1).

Figure 5A:
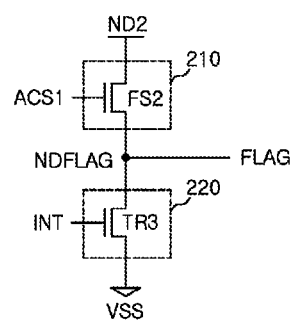
FIG. 5A is a circuit diagram showing in detail the initialization control unit shown in FIG. 2.

FIG. 5a is a circuit diagram showing in detail the initialization control unit 200 shown in FIG. 2.

The initialization control unit 200 may include a flag program section 210 and a flag control section 220. The flag program section 210 may electrically connect a second node ND2 to a flag node NDFLAG, and the flag control section 220 may electrically connect the flag node NDFLAG to the ground voltage terminal VSS. The initialization flag FLAG may be outputted from the flag node NDFLAG.

The flag program section 210 may be programmed in response to the first access signal ACS1, and, as a result, may serve as a resistor. Therefore, the flag node NDFLAG has a high voltage level and output the high voltage as the initialization flag FLAG. The flag program section 210 may include a second antifuse FS2.

The second antifuse FS2 may be ruptured in response to the first access signal ACS1. The flag program section 210 may be programmed by rupturing the second antifuse FS2. The ruptured second antifuse FS2 may supply a voltage to the flag node NDFLAG in response to the first access signal ACS1, and the supplied voltage may indicate that the flag program section 210 is programmed. The first access signal ACS1 may be enabled as a high voltage pulse with a level enough to rupture the second antifuse FS2. After the second antifuse FS2 is ruptured, the first access signal ACS1 may be enabled to a lower level, for example, the level of an external voltage.

The second antifuse FS2 may electrically connect the second node ND2 to the flag node NDFLAG. Also, the second antifuse FS2 may be applied with the first access signal ACS1 through the gate thereof. The second node ND2 may be a floating node.

The flag control section 220 may electrically connect the flag node NDFLAG to a ground voltage terminal VSS in response to the initialization signal INT. The flag control section 220 may control the voltage level of the source terminal of the second antifuse FS2, by connecting the flag node NDFLAG to the ground voltage terminal VSS. In the case where the flag control section 220 is applied with the enabled initialization signal INT and the second antifuse FS2 is applied with the first access signal ACS1 enabled to the high voltage, the voltage between the gate and the source of the second antifuse FS2 may be enough to rupture the second antifuse FS2.

The flag control section 220 may include a third transistor TR3. The third transistor TR3 may electrically connect the flag node NDFLAG to the ground voltage terminal VSS, and may be applied with the initialization signal INT through the gate thereof.

Figure 5B:
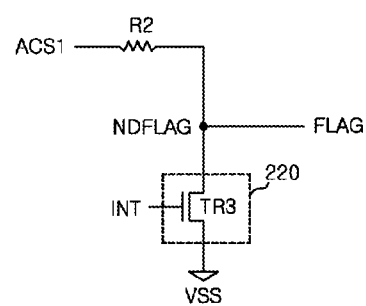
FIG. 5B shows an equivalent circuit of the initialization control unit which is programmed.

FIG. 5b shows an example of an equivalent circuit of the initialization control unit 200 which is programmed. In FIG. 5b, the same reference numerals as in FIG. 5a will be used to refer to component elements substantially the same as those of FIG. 5a.

The initialization control unit 200a may be programmed by rupturing the second antifuse FS2. The ruptured second antifuse FS2 to may be equivalent to a second resistor R2. The first access signal ACS1 may be provided through the second resistor R2 to the flag node NDFLAG as the initialization flag FLAG.

Figure 6:
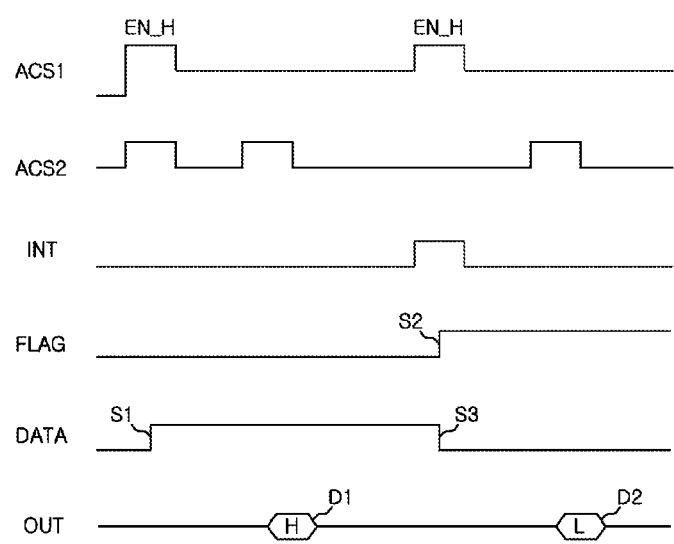
FIG. 6 is a waveform diagram explaining operations of the data storage circuit shown in FIG. 1.

FIG. 6 is a waveform diagram explaining operations of the data storage circuit 10 shown in FIG. 1.

Referring to FIGS. 1 to 6, the data storage circuit 10 may be programmed, may output data indicating its programmed state, may be initialized, and may output data indicating its initialized state.

The first access signal ACS1 and the second access signal ACS2, which are enabled, may program the data storage unit 100. The first access signal ACS1 may be enabled to a high voltage level EN_H to program the data storage unit 100. The first transistor TR1 may electrically connect the source terminal of the first antifuse FS1 to the output line OUT in response to the enabled second access signal ACS2. The first antifuse FS1 may be ruptured in response to the first access signal ACS1 which is enabled to the high voltage level EN_H. The ruptured first antifuse FS1 may mean a programmed state. The first antifuse FS1, which has been programmed (e.g., ruptured) may provide a voltage to the data node DATA. The second transistor TR2 may not be turned on since the initialization flag FLAG is not provided thereto.

The data storage unit 100 may output data D1 indicating a programmed state to the output line OUT in response to the first access signal ACS1 and the second access signal ACS2 which are enabled. The first transistor TR1 may output the data D1 having a logic high value H from the data node DATA to the output line OUT in response to the enabled second access signal ACS2.

The initialization control unit 200 may be programmed in response to the first access signal ACS1 and the initialization signal INT which are enabled. The first access signal ACS1 may be enabled to the high voltage level EN_H to program the initialization control unit 200 and output the initialization flag FLAG. The third transistor TR3 may electrically connect the source terminal of the second antifuse FS2 to the ground voltage terminal VSS in response to the initialization signal INT which is enabled. The second antifuse FS2 may be ruptured in response to the first access signal ACS1 which is enabled to the high voltage. As a result, the second antifuse FS2 may provide the initialization flag FLAG to the initialization section 130 (S2). The third transistor TR3 may be turned off in response to the disabled initialization signal INT.

The data storage unit 100 may be initialized in response to the initialization flag FLAG. The second transistor TR2 may connect the data node DATA to a ground voltage terminal VSS in response to the initialization flag FLAG, and the data node DATA may be initialized (S3).

The data storage unit 100 may output data indicating an initialized state to the output line OUT in response to the first access signal ACS1 and the second access signal ACS2 which are enabled (D2). The first transistor TR1 may output data having a logic low value L from the data node DATA to the output line OUT in response to the enabled second access signal ACS2.

Figure 7:
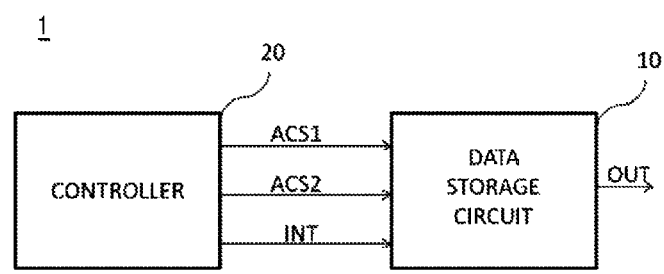
FIG. 7 is a block diagram showing a system including a is controller and a data storage circuit.

Referring to FIG. 7, an electronic system 1 may include a data storage circuit 10 and a controller 20. The controller 20 may is generate a first access signal ACS1, a second access signal ACS2, and an initialization signal INT. The data storage circuit 10 may be programmed in response to the first access signal ACS1 and the second access signal ACS2. The data storage circuit 10 may be initialized in response to the first access signal ACS1 and the initialization signal INT, and output data indicating whether the data storage circuit 10 is programmed or initialized to an output line OUT in response to the first access signal ACS1 and the second access signal ACS2.

While certain embodiments have been described above, it will be understood to those skilled in the art that the embodiments described are by way of example only. Accordingly, the data storage circuit described herein should not be limited based on the described embodiments. Rather, the data storage circuit described herein should only be limited in light of the claims that follow when taken in conjunction with the above description and accompanying drawings.

What is claimed is:

1. A data storage circuit, comprising:
a first antifuse configured to be programmed in response to a first access signal, and provide data indicating whether the first antifuse is programmed to a data node;
an initialization section configured to control a voltage level of the data node in response to an initialization flag; and
a second antifuse configured to be programmed in response to the first access signal, and provide the initialization flag indicating whether the second antifuse is programmed to the initialization section.

2. The data storage circuit according to claim 1, further comprising:
a flag control section configured to control a voltage level of a source terminal of the second antifuse in response to an initialization signal.

3. The data storage circuit according to claim 2, wherein the second antifuse is programmed when the first access signal and the initialization signal are enabled.

4. The data storage circuit according to claim 1, further comprising:
an access control section configured to electrically connect the data node to an output line in response to a second access signal.

5. The data storage circuit according to claim 4, wherein the first antifuse is programmed when the first access signal and the second access signal are enabled.

6. The data storage circuit according to claim 1, wherein the first access signal is enabled to a high voltage such that the first antifuse or the second antifuse is ruptured by the high voltage.

7. A data storage circuit, comprising:
a first antifuse configured to be programmed in response to a first access signal, and provide data indicating whether the first antifuse is programmed to a data node;
an initialization section configured to electrically connect the data node to a ground voltage terminal in response to an initialization flag;
an access control section configured to output data which is provided to the data node, to an output line in response to a second access signal, and
a flag program section configured to be programmed in response to the first access signal and provide the initialization flag.

8. The data storage circuit according to claim 7, wherein the flag program section includes a second antifuse configured to be programmed in response to the first access signal, and provide the initialization flag indicating whether the second antifuse is programmed to the initialization section.

9. The data storage circuit according to claim 8, further comprising:
a flag control section configured to electrically connect a source terminal of the second antifuse to the ground voltage terminal in response to an initialization signal.

10. The data storage circuit according to claim 9, wherein the second antifuse is programmed when the first access signal and the initialization signal are enabled.

11. The data storage circuit according to claim 10, wherein the first access signal is enabled to a high voltage such that the first antifuse or the second antifuse is ruptured by the high voltage.

12. An electronic system, comprising:
a controller configured to generate a first access signal, a second access signal, and an initialization signal;
a data storage circuit configured to be controlled by the controller,
wherein the data storage circuit comprises:
a data storage unit configured to be programmed in response to the first access signal and the second access signal, be initialized in response to an initialization flag, and output data indicating whether the data storage circuit is programmed or initialized in response to the first access signal and the second access signal; and
an initialization control unit configured to be programmed in response to the first access signal and the initialization signal, and provide the initialization flag to the data storage unit.

13. The electronic system according to claim 12, wherein the data storage unit comprises:
a first antifuse configured to be ruptured in response to the first access signal, and provide data indicating whether the first antifuse is ruptured to a data node.

14. The electronic system according to claim 13, wherein the data storage unit further comprises:
an initialization section configured to electrically connect the data node to a ground voltage terminal in response to the initialization flag.

15. The electronic system according to claim 13, wherein the data storage unit further comprises:
an access control section configured to electrically connect the data node to the output line in response to the second access signal.

16. The electronic system according to claim 13, wherein the first access signal is enabled to a high voltage such that the first antifuse is ruptured by the high voltage.

17. The electronic system according to claim 12, wherein the initialization control unit comprises:
a second antifuse configured to be ruptured in response to the first access signal, and provide the initialization flag indicating whether the second antifuse is ruptured to the data storage unit.

18. The electronic system according to claim 17, wherein the initialization control unit further comprises:
a flag control section configured to control a voltage level of a source terminal of the second antifuse in response to the initialization signal.

19. The electronic system according to claim 18, wherein the second antifuse is ruptured when the first access signal and the initialization signal are enabled.

* * * * *